(12) United States Patent
Hancock

(10) Patent No.: US 11,940,182 B2
(45) Date of Patent: Mar. 26, 2024

(54) SOLAR-POWERED GENERATOR

(71) Applicant: David W. Hancock, Woodbridge, VA (US)

(72) Inventor: David W. Hancock, Woodbridge, VA (US)

( * ) Notice: Subject to any disclaimer, the term of this patent is extended or adjusted under 35 U.S.C. 154(b) by 113 days.

(21) Appl. No.: 17/330,952

(22) Filed: May 26, 2021

(65) Prior Publication Data

US 2022/0381430 A1 Dec. 1, 2022

(51) Int. Cl.

| F24S 20/20 | (2018.01) |
|---|---|
| F22B 1/00 | (2006.01) |
| F24S 23/70 | (2018.01) |
| H01L 31/042 | (2014.01) |
| H01L 31/054 | (2014.01) |
| H02S 10/00 | (2014.01) |
| H02S 40/22 | (2014.01) |

(52) U.S. Cl.
CPC .............. *F24S 20/20* (2018.05); *F22B 1/006* (2013.01); *F24S 23/70* (2018.05); *H01L 31/042* (2013.01); *H01L 31/0547* (2014.12); *H02S 10/00* (2013.01); *H02S 40/22* (2014.12); *Y02E 10/46* (2013.01)

(58) Field of Classification Search
CPC . F22B 1/006; F24S 20/20; F24S 23/30; F24S 23/00; F24S 23/72; F24S 23/74; H02S 10/00; H02S 40/22; Y02E 10/44; Y02E 10/40; Y02E 10/46; B01D 1/0035; C02F 1/14; Y02B 10/20
USPC .................................. 126/689, 698, 634, 683
See application file for complete search history.

(56) References Cited

U.S. PATENT DOCUMENTS

| 3,182,654 | A |   | 5/1965  | Culling |             |
|-----------|---|---|---------|---------|-------------|
| 3,905,352 | A |   | 9/1975  | Jahn    |             |
| 4,002,031 | A | * | 1/1977  | Bell    | H02S 40/44  |
|           |   |   |         |         | 60/641.15   |
| 4,043,315 | A |   | 8/1977  | Cooper  |             |
| 4,056,093 | A |   | 11/1977 | Barger  |             |

(Continued)

FOREIGN PATENT DOCUMENTS

| CN | 102095257 | 7/2012 |
| CN | 202470473 | 10/2012 |

(Continued)

*Primary Examiner* — Wesley G Harris
(74) *Attorney, Agent, or Firm* — Diederiks & Whitelaw, PLC.

(57) ABSTRACT

A solar-powered generator captures solar energy and generates steam with the energy. The generator includes a container formed with an inner spherical wall defining an inner chamber and having an inner reflective surface containing photovoltaic cells and an outer spherical wall defining an outer chamber located between the inner and outer spherical walls. The container is formed to allow for sunlight to enter the inner chamber. An inlet port is configured to allow water to enter the outer chamber and an outlet port is configured to allow steam to exit the outer chamber, whereby sunlight entering the inner chamber through the passage bounces off of the inner reflective surface allowing thermal energy to heat the water in the outer chamber to create steam to generate electricity through an external steam turbine. While simultaneously using radiant energy to be absorbed by photovoltaic cells to generate additional electricity.

14 Claims, 4 Drawing Sheets

(56) References Cited

U.S. PATENT DOCUMENTS

| | | | |
|---|---|---|---|
| 4,081,289 A | 3/1978 | Campbell | |
| 4,166,769 A | 9/1979 | Dukess | |
| 4,276,122 A | 6/1981 | Snyder | |
| 4,280,482 A | 7/1981 | Nilsson, Sr. | |
| 4,395,582 A * | 7/1983 | Damsker | F24S 40/55 126/569 |
| 4,400,946 A | 8/1983 | Oplatka | |
| 4,422,434 A | 12/1983 | Statz et al. | |
| 5,047,654 A * | 9/1991 | Newman | G03F 7/022 290/52 |
| 7,669,592 B2 | 3/2010 | Polk | |
| 8,544,272 B2 | 10/2013 | Kroizer et al. | |
| 8,656,717 B1 | 2/2014 | Parker | |
| 9,534,811 B2 | 1/2017 | Ruiz | |
| 9,657,724 B2 | 5/2017 | Mastrobuono | |
| 2008/0163922 A1* | 7/2008 | Horne | F24S 23/79 136/246 |
| 2010/0192944 A1 | 8/2010 | Gruber | |
| 2011/0247682 A1 | 10/2011 | Harper et al. | |
| 2012/0145223 A1* | 6/2012 | Weekley | H02S 40/44 126/621 |

FOREIGN PATENT DOCUMENTS

| | | | |
|---|---|---|---|
| CN | 102322694 | 5/2013 | |
| CN | 109681852 | 4/2019 | |
| CN | 111565019 | 8/2020 | |
| DE | 29923863 U1 * | 8/2001 | F24J 2/07 |
| EP | 147345 | 6/1990 | |
| FR | 2446997 | 8/1980 | |
| FR | 2461210 | 2/1983 | |
| FR | 2556825 | 6/1985 | |
| JP | 58099645 A * | 6/1983 | F24J 3/02 |
| WO | 8404806 | 12/1984 | |
| WO | 2016116931 | 7/2016 | |

* cited by examiner

SOLAR-POWERED GENERATOR

BACKGROUND OF THE INVENTION

The present invention pertains to an apparatus for capturing solar energy and employing the solar energy to create electricity.

Solar energy travels millions of miles from the sun until striking a target that absorbs the energy. Some current solar-powered generator systems employ towers with large tanks of water located at the top of each tower. Mirrors are positioned to reflect sunlight toward the outer surface of the tanks to heat the water in each tank from the outside of each tank. Generally, such systems arrange the mirrors to focus the sun's rays on the tanks. The heated water is then used to generate electricity with a steam turbine. Other types of solar powered electric generators are based on directly converting the sun's rays into electricity with photovoltaic cells.

A variety of solar-powered generators have been proposed, especially in areas that have relatively high amounts of sunlight. The electricity produced by solar-powered generators is used to provide power for a wide variety of uses. For example, the electricity may power residential buildings or commercial operations. The abundance of electricity can also be used to run desalinization plants to convert sea water into drinking water or water for use in irrigation. However, the prior art devices have met with varying degrees of success and efficiency.

Accordingly, there is a need in the art for solar-powered generator that is inexpensive and efficient.

SUMMARY OF THE INVENTION

The present invention is directed to a solar-powered generator that captures solar energy. This solar-powered generator allows the sun's radiation and light to enter an inner chamber and bounce endlessly inside of the inner chamber until the heat and radiation of the sunlight have been captured. An outer chamber containing water surrounds the inner chamber. The solar-powered generator is configured to heat the water from within by directing sunlight on an inner wall of the outer chamber rather than directing sunlight to the chamber's outer wall. Such an arrangement is different from the prior art systems that have hundreds of mirrors in a mirror array focusing on the outside of a tower containing water.

In a preferred embodiment, the invention is directed to a solar-powered generator for capturing solar energy and generating steam with the solar energy. The solar-powered generator includes a container with an inner spherical wall defining an inner chamber and having an inner reflective surface containing photovoltaic cells. The container also has an outer spherical wall defining an outer chamber located between the inner spherical wall and the outer spherical wall. The outer spherical wall is formed with a hole that is aligned with a hole in the inner spherical wall. The holes are joined by a tube forming a passage that extends through the outer chamber and through the inner spherical wall. The passage is arranged to allow for sunlight to pass through the outer chamber and enter the inner chamber.

An inlet port is configured to allow water to enter the outer chamber. An outlet port is configured to allow steam to exit the outer chamber. Sunlight entering the inner chamber through the tube passage bounces off of the inner reflective surface heating the inner sphere converting the water in the outer chamber into steam energy to run a turbine to create electricity. Simultaneously, the sunlight striking the photovoltaic cells to generate electricity.

A magnifying glass is preferably mounted outside the outer spherical wall and near the passage. The magnifying glass (convex lens) is configured to concentrate the sunlight so that more sunlight travels through the passage into the inner chamber of the sphere.

An incoming water control valve is located in the inlet port and is configured to control the amount of fresh water traveling into the outer chamber. An outgoing steam release valve is located in the outlet port and is configured to control the release of steam from the outer chamber through the outlet port. Preferably, a steam turbine and an electrical generator are located downstream of the outlet port and are connected to the outlet port by a conduit that transfers the steam from the outlet port to the steam turbine. The steam turbine and electrical generator are configured to generate electricity from the steam released from the outer chamber.

In use, sunlight is directed by the magnifying glass into the container through the hole formed in the outer spherical wall of the container and through the passage to the inner chamber formed by the inner spherical wall. The sunlight is then reflected off of the inner reflective surface of the inner spherical wall and onto the photovoltaic cells causing the photovoltaic cells to generate electricity. Water is introduced through the inlet port into the outer chamber formed between the outer spherical wall and the inner spherical wall. The sunlight will bounce off of the inner reflective surface until it is absorbed as energy through the inner spherical wall and then is absorbed by the water in the outer chamber. The water in the outer chamber will be heated until the water turns to steam. Next the steam is allowed to exit the outer chamber through the outlet port and is direct to the steam turbine which drives the electrical generator to produce additional electrical energy.

These solar-powered generators can be placed all over the world but will be most effective in areas that receive large amounts of uninterrupted sunshine. The solar-powered generator of this invention operates independently of any mirror array. These solar-powered generators will be used to generate large amounts of electrical energy and can be used in both remote areas as well as near metropolitan areas. There is no pollution or adverse environmental effects caused by the solar-powered generators. The solar-powered generators can be constructed relatively easy and cost effectively. The abundance of cheap electricity produced by the solar-powered generators can also be used to generate hydrogen which can be used to generate electricity in other parts of the world or on cloudy days or at nighttime. The use of solar energy can greatly reduce the generation of greenhouse gases and the dependence on nuclear or carbon-based energy. The solar-powered generator could also be used on the International Space Station to generate power and purify water.

Additional objects, features and advantages of the present invention will become more readily apparent from the following detailed description of preferred embodiments when taken in conjunction with the drawings wherein like reference numerals refer to corresponding parts in the several views.

DETAILED DESCRIPTION OF THE PREFERRED EMBODIMENTS

Figure 1:
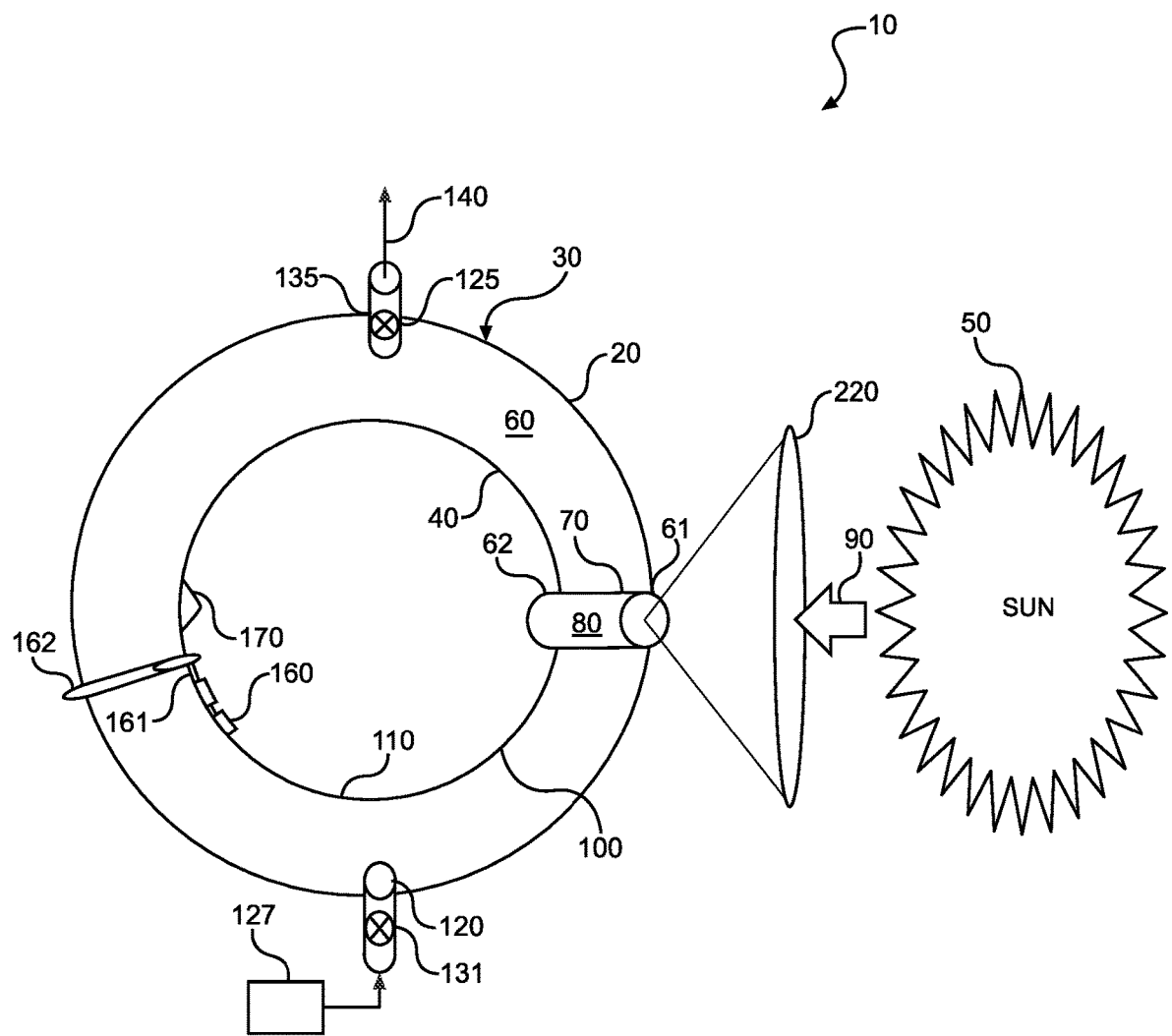
FIG. 1 is a schematic view of a solar-powered generator including a container with an inner chamber and an outer chamber in accordance with a preferred embodiment of the invention.

Detailed embodiments of the present invention are disclosed herein. However, it is to be understood that the disclosed embodiments are merely exemplary of the invention that may be embodied in various and alternative forms. The figures are not necessarily to scale, and some features may be exaggerated or minimized to show details of particular components. Therefore, specific structural and functional details disclosed herein are not to be interpreted as limiting but merely as a representative basis for teaching one skilled in the art to variously employ the present invention.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

Throughout this specification and the claims which follow, unless the context requires otherwise, the word "comprise", and variations such as "comprises" and "comprising" means various components can be co-jointly employed in the methods and articles (e.g., compositions and apparatuses including device and methods). For example, the term "comprising" will be understood to imply the inclusion of any stated elements or steps but not the exclusion of any other elements or steps.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. Any numerical values given herein should also be understood to include about or approximately that value, unless the context indicates otherwise. Any numerical range recited herein is intended to include all sub-ranges subsumed therein.

The following detailed description should be read with reference to the drawings in which similar elements in different drawings are numbered the same. The detailed description and the drawings, which are not necessarily to scale, depict illustrative embodiments and are not intended to limit the scope of the disclosure. Instead, the illustrative embodiments depicted are intended only as exemplary. Selected features of any illustrative embodiment may be incorporated into another embodiment unless clearly stated to the contrary. While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents and alternatives falling within the spirit and scope of the disclosure.

With initial reference to FIG. 1, there is shown a solar-powered generator 10 of the present invention. Solar-powered generator 10 is shown with an outer spherical wall 20 that forms a container 30. The outer spherical wall 20 is shown as being shaped as a sphere. However, other shapes could be employed. The outer spherical wall 20 of solar-powered generator 10 is preferably rigid.

The solar-powered generator 10 includes an inner spherical wall 40, thus creating a shape that is a sphere within a sphere. The outer spherical wall 20 and the inner spherical wall 40 form an outer chamber 60 therebetween. The outer and inner spherical walls 20, 40 are designed to be strong enough to hold pressurized steam in the outer chamber 60. Preferably the outer and inner spherical walls 20, 40 are made of a robust material such as steel or iron and can withstand being subjected to high temperatures and pressures. The outer spherical wall 20 may be made of several layers and be insulated to retain heat within the container 30. The inner spherical wall 40, by contrast, is preferably made of one or more materials that conduct heat. Small holes 61, 62, in outer and inner spherical walls 20, 40, respectively, are lined up with each other and connected by a tube 70 that forms a passage 80 that allows sunlight 90 from sun 50 to enter an inner chamber 100 formed by the inner spherical wall 40. The inner spherical wall 40 is lined with a highly reflective surface.

The outer chamber 60 is sealed and capable of withstanding very high levels of pressure and high temperatures. There are two external openings or ports 120, 125 formed in the outer spherical wall 20 preferably on opposing sides of the container 30. One port is an inlet port 120 configured to let in cool water 127. The input port 120 is preferably fitted with an incoming water control valve 131 in order to control the amount of water 127 following into the outer chamber 60. In an analogous manner the outlet port 125 is fitted with an outgoing steam release valve 135 to regulate the amount of steam 140 leaving the outer chamber 60. Sunlight 90 entering the inner chamber 100 through the passage 80 bounces off of the inner reflective surface 110. Preferably, the inner reflective surface 110 has photovoltaic cells 160 mounted therein which are connected to a wire 161 and allow electrical energy to leave the solar-powered generator 10 through a conduit 162.

To prevent light 90 that is directed to the back of the spherical inner chamber 40 from bouncing back out of the passage 80, a small cone-shaped reflector 170 will be placed at the back of the inner sphere. The cone-shaped reflector 170 is positioned opposite passage 80 to spread out incoming sunlight 90 to prevent the incoming sunlight 90 from being reflected back into passage 80. This will disperse the energy away from the hole 62. The entry tube 70 where the light 90 enters will extend into the inner chamber 100 by a couple of inches to help prevent energy from exiting the container 30.

As mentioned above, the inner spherical wall 40 has a highly reflective surface 110 that bounces the sunlight 90 back and forth across the spherical inner chamber 100 and includes photovoltaic cells 160 interwoven within that generate electricity. The photovoltaic cells 160 constitute solar panels that can convert sunlight into electricity. The sunlight 90 that is reflected off of the inner reflective surface 110 of the inner spherical wall 40 at the cone-shaped reflector 170 and onto photovoltaic cells 160 causes the photovoltaic cells 160 to generate electricity.

Figure 4:
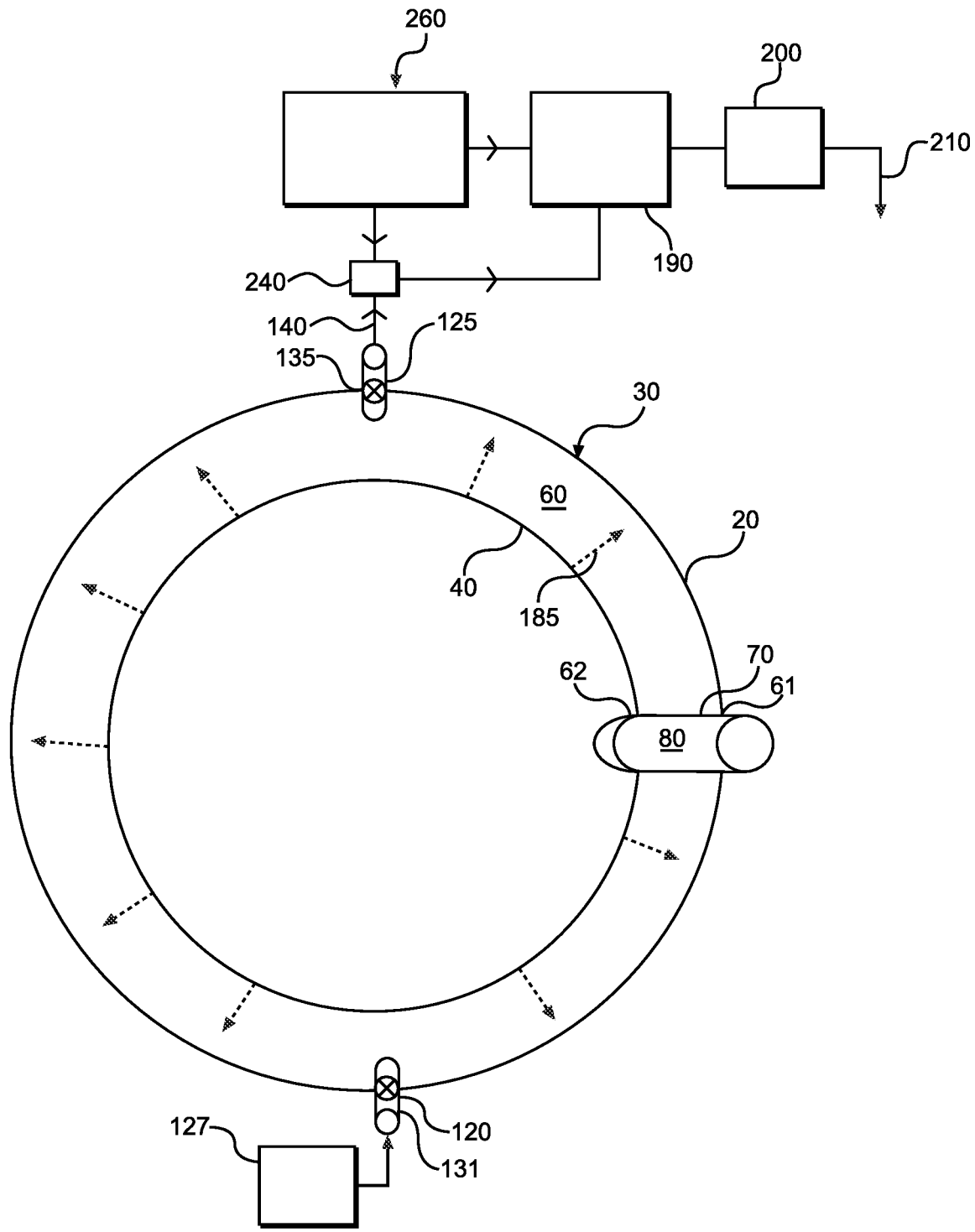
FIG. 4 is a schematic cross-sectional view of the container of FIG. 1 showing thermal energy radiating from the inner spherical wall into the outer chamber and showing the container of FIG. 1 connected to a turbine and an electrical generator.

Water 127 is introduced through the inlet port 120 into the outer chamber 60 formed between the outer spherical wall 20 and the inner spherical wall 40. The sunlight 90 will bounce off of the inner reflective surface 110 at many different points 180 until it is absorbed as energy through the inner spherical wall 40 and then is absorbed by the water 127 in the outer chamber 60. The continuous stream of concentrated sunlight 90 will generate heat to heat the water 127 that is contained in the outer chamber 60 between the two spherical walls 20, 40. The water 127 in the outer chamber 60 will be heated until the water 127 turns to steam 140. Once sufficient pressure builds up from the heated water 127 turning into steam 140, the steam 140 will escape through one of the external openings, outlet port 125 and be replaced by fresh water 127. Next, as best seen in FIG. 4, the steam 140 that is allowed to exit the chamber 60 through the outlet port 125 is directed to a turbine 190 and an electrical generator 200 to produce electrical energy 210. The steam pressure is vented into the steam turbine 190.

Figure 2:
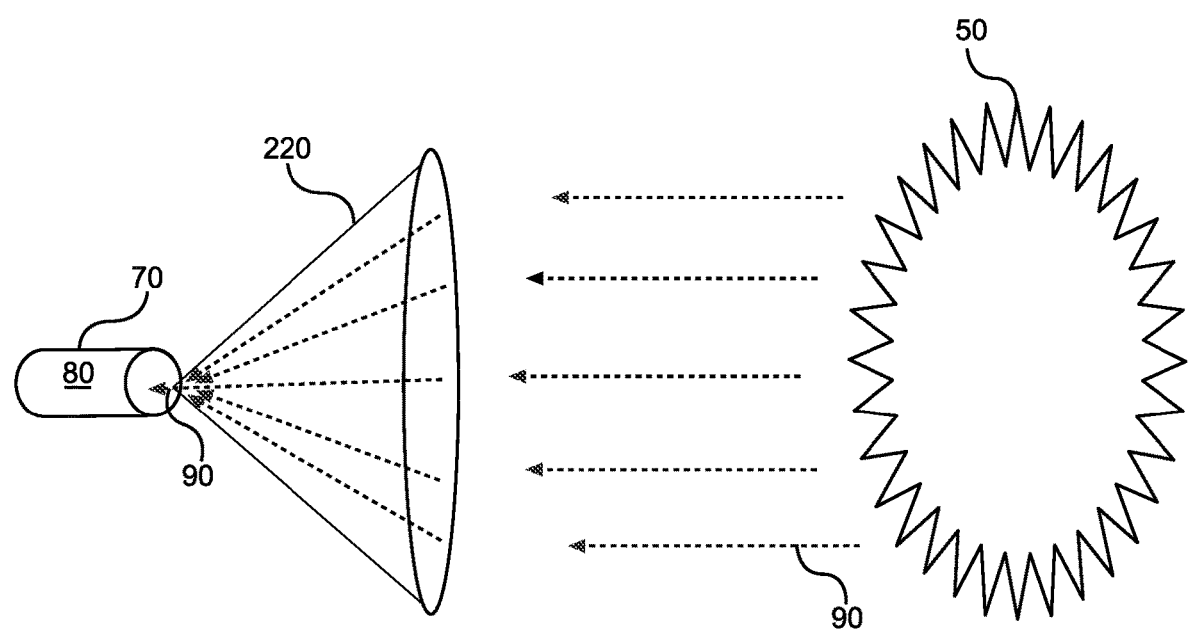
FIG. 2 is a schematic view of a magnifying glass (convex lens) for concentrating sunlight and directing the sunlight into the container of FIG. 1.

As best seen in FIG. 2, preferably a large magnifying glass 220 mounted outside the outer spherical wall 20 focuses the sunlight 90 from the sun 50 into the connecting tube 70 and into the inner chamber 100. The magnifying glass 220 is a large convex lens to focus the sunlight through the small opening 61. The magnifying glass 220 can be adjusted closer or further from the outer spherical wall 20 and the angle of the glass 220 can also be adjusted to maximize the amount of sunlight 90 sent into the tube 70 and thus inner chamber 100. This will allow for usage anywhere in the world and during any season.

Figure 3:
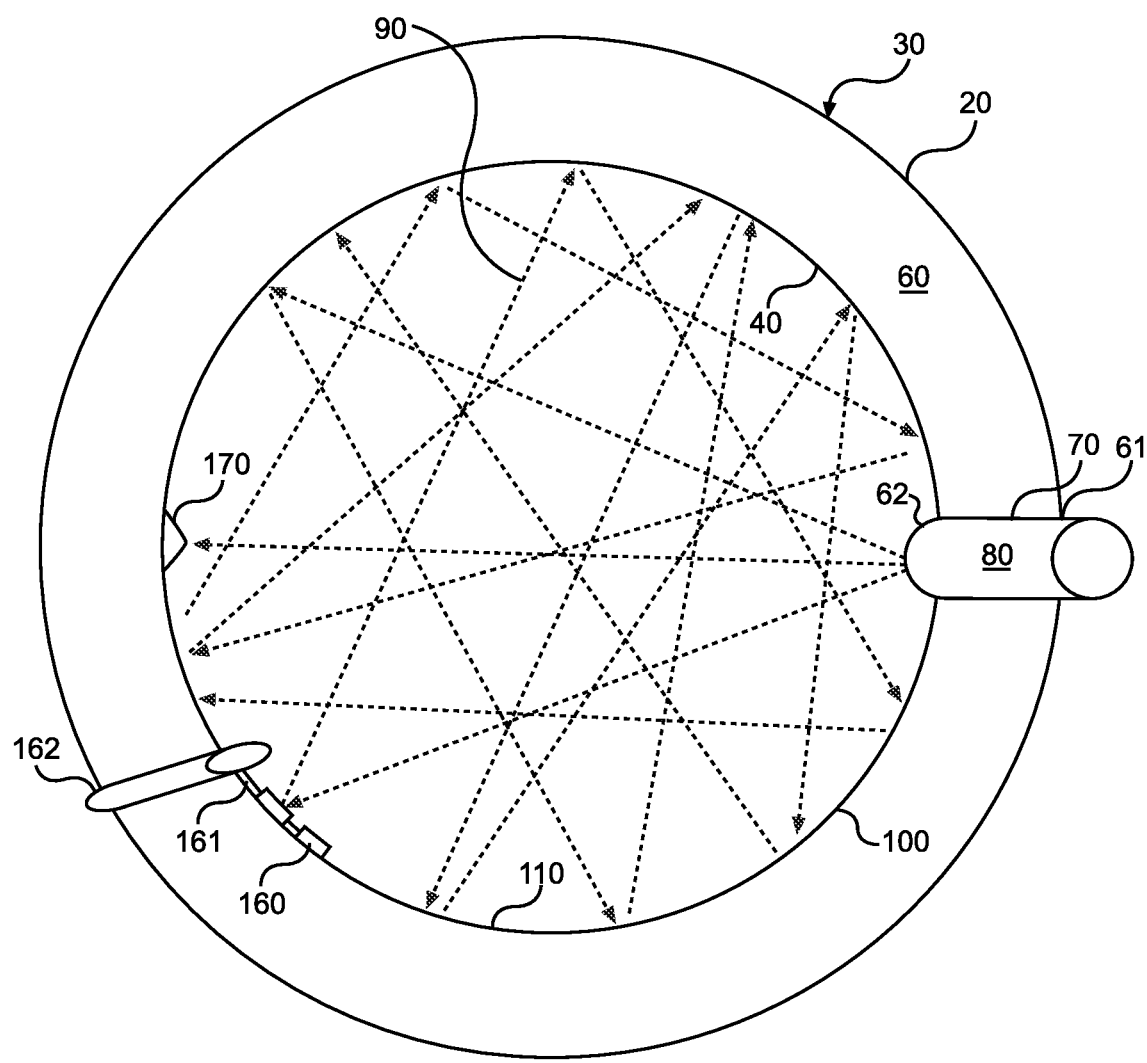
FIG. 3 is a schematic cross-sectional view of the container of FIG. 1 showing sunlight reflecting off of an inner reflective surface of the inner chamber.

In use, and as best seen in FIG. 3, concentrated sunlight 90 is directed into the container 30 through the hole 61 formed in the outer spherical wall 20 of the container 30 and through the passage 80 to the inner chamber 100 formed by the inner spherical wall 40. The sunlight 90 that is directed into the small opening 61 will be reflected unimpeded around the inner sphere's reflective surface 110. As shown in FIG. 4, the light 90 heats the water in the outer chamber 60. The steam 140 travels to a turbine 190 connected to an electrical generator 200 which produces electricity 210. A connection 240 can be made to additional solar generators, shown at 260. The steam 140 from each generator can then travel through the connector 240 to the turbine 190 or travel directly to the turbine 190.

The examples and illustrations included herein show, by way of illustration and not of limitation, specific embodiments in which the subject matter may be practiced. As mentioned, other embodiments may be utilized and derived there from, such that structural and logical substitutions and changes may be made without departing from the scope of this disclosure. Such embodiments of the inventive subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

For example, to increase the efficiency of the system the solar-powered generator or the magnifying glass can be placed on a pivoting system so that it can track sunlight throughout the day, multiple spheres can be linked to the steam turbine to generate additional power. The size of the spheres can be varied based on cost and need for electrical power in that area. In areas of the world where large amounts of power are needed, numerous spheres can be linked together to run much larger thermal generators as well as produce large amounts of electricity from solar energy. These devices can be placed all over the world but will be most effective in areas that receive large amounts of uninterrupted sunshine. These devices will be used to generate large amounts of electrical energy and can be used in both remote areas as well as near metropolitan areas. There is no pollution or environmentally bad effects generated by these devices. These devices can be constructed relatively easy and cost effectively Although various illustrative embodiments are described above, any of a number of changes may be made to various embodiments without departing from the scope of the invention as described by the claims. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

As can be seen from the above description a solar-powered generator has been described that efficiently generates steam with the collected solar energy.

The invention claimed is:

1. A solar-powered generator for capturing solar energy and generating steam with the solar energy comprising:
   a container including an inner spherical wall defining an inner chamber and having an inner reflective surface containing photovoltaic cells;
   an outer spherical wall defining an outer chamber located between the inner spherical wall and the outer spherical wall;
   a passage that extends from the outer spherical wall, through the inner spherical wall and is arranged to allow for sunlight to pass through the outer chamber and enter the inner chamber;
   an inlet port configured to allow water to enter the outer chamber; and
   an outlet port configured to allow steam to exit the outer chamber and be routed to a steam turbine, wherein the sunlight entering the inner chamber through the passage bounces off of the inner reflective surface while heating the water in the outer chamber and is absorbed by the photovoltaic cells to generate electricity directly.

2. The solar-powered generator of claim 1 further comprising a magnifying glass mounted outside the outer spherical wall and near the passage and configured to concentrate the sunlight so that the sunlight travels through the passage into the inner chamber.

3. The solar-powered generator of claim 1 further comprising an incoming water control valve located in the inlet port and configured to control the water entering the outer chamber.

4. The solar-powered generator of claim 1 further comprising a steam release valve located in the outlet port and configured to control a release of steam from the outer chamber through the outlet port.

5. The solar-powered generator of claim 1 further comprising an electrical generator located downstream of the outlet port and configured to generate the electricity from the steam.

6. The solar-powered generator of claim 1 further comprising a small cone-shaped reflector located on the inner reflective surface of the inner chamber, said small cone-shaped reflector being configured to reflect light away from the passage.

7. The solar-powered generator of claim 1 further comprising an additional container including:
   a second inner spherical wall defining a second inner chamber and having a second inner reflective surface containing photovoltaic cells;
   a second outer spherical wall defining a second outer chamber located between the second inner spherical wall and the second outer spherical wall;
   a second passage that extends from the second outer spherical wall, through the second inner spherical wall and is arranged to allow for sunlight to pass through the second outer chamber and enter the second inner chamber;
   a second inlet port configured to allow water to enter the second outer chamber; and
   a second outlet port configured to allow steam to exit the second outer chamber, whereby the sunlight entering the second inner chamber through the second passage bounces off of the second inner reflective surface while heating the water in the second outer chamber and is absorbed by the photovoltaic cells of the second inner reflective surface to generate electricity.

8. A method of generating electricity with a solar-powered generator including a container, said method comprising
   directing sunlight into the container through a hole formed in an outer spherical wall of the container and through a passage to an inner chamber formed by an inner spherical wall;
   reflecting the sunlight off of an inner reflective surface of the inner spherical wall and onto photovoltaic cells located on the inner reflective surface and causing the photovoltaic cells to generate the electricity;
   introducing water through an inlet port into an outer chamber formed between the outer spherical wall and the inner spherical wall;
   allowing steam to exit the outer chamber through an outlet port;
   directing the steam to a turbine and an electrical generator.

9. The method of claim 8 further comprising concentrating the sunlight with a magnifying glass mounted outside the outer spherical wall and near the passage so that the sunlight travels through the passage into the inner chamber.

10. The method of claim 8 further comprising controlling the water entering the outer chamber with an incoming water control valve located in the inlet port.

11. The method of claim 8 further comprising controlling the release of the steam from the outer chamber through the outlet port with a steam release valve located in the outlet port.

12. The method of claim 8 further comprising generating the electricity from the steam with the turbine and the electrical generator located downstream of the outlet port.

13. The method of claim 8 further comprising reflecting the sunlight away from the passage with a small cone-shaped reflector located on the inner reflective surface of the inner chamber.

14. The method of claim 8 further comprising
   generating electricity with an additional container including:
   directing sunlight into the additional container through a hole formed in an outer spherical wall of the additional container and through a passage to an inner chamber formed by an inner spherical wall of the additional container;
   reflecting the sunlight off of an inner reflective surface of the inner spherical wall of the additional container and onto additional photovoltaic cells located on the inner reflective surface of the inner spherical wall of the additional container;
   introducing water through an inlet port into an outer chamber formed between the outer spherical wall and the inner spherical wall of the additional container;
   allowing steam to exit the outer chamber through an outlet port of the additional container;
   directing the steam to the turbine and the electrical generator.

* * * * *